United States Patent
Seo et al.

(10) Patent No.: US 12,132,979 B2
(45) Date of Patent: Oct. 29, 2024

(54) OPTICAL DEVICE

(71) Applicant: LG INNOTEK CO., LTD., Seoul (KR)

(72) Inventors: Eun Sung Seo, Seoul (KR); Young Woon Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/219,485

(22) Filed: Jul. 7, 2023

(65) Prior Publication Data
US 2023/0353856 A1  Nov. 2, 2023

Related U.S. Application Data

(63) Continuation of application No. 17/632,291, filed as application No. PCT/KR2020/011212 on Aug. 21, 2020, now Pat. No. 11,729,485.

(30) Foreign Application Priority Data

Aug. 28, 2019 (KR) .......... 10-2019-0106058

(51) Int. Cl.
*H04N 23/57* (2023.01)
*G02B 5/30* (2006.01)
*G09G 3/3208* (2016.01)
*H10K 50/86* (2023.01)
*H10K 59/65* (2023.01)

(52) U.S. Cl.
CPC ........... *H04N 23/57* (2023.01); *G09G 3/3208* (2013.01); *H10K 50/86* (2023.02); *H10K 59/65* (2023.02); *G02B 5/3083* (2013.01)

(58) Field of Classification Search
CPC .... H10K 50/86; H10K 59/8791; H10K 59/65; H04M 1/02; H04M 1/725; H04N 23/57; H04N 23/55; G02B 5/26; G02B 5/3083; G09G 3/3208
See application file for complete search history.

(56) References Cited

U.S. PATENT DOCUMENTS

| | | | |
|---|---|---|---|
| 9,372,505 B2 | 6/2016 | Mathew et al. | |
| 10,222,618 B2 * | 3/2019 | Border | G06F 3/013 |
| 10,777,623 B2 | 9/2020 | Rhee et al. | |
| 10,895,773 B1 | 1/2021 | Zhang | |
| 10,908,450 B2 * | 2/2021 | Son | H04N 23/57 |
| 11,056,518 B2 | 7/2021 | Mitani et al. | |

(Continued)

FOREIGN PATENT DOCUMENTS

| | | |
|---|---|---|
| CN | 1247326 A | 3/2000 |
| CN | 101783360 A | 7/2010 |

(Continued)

*Primary Examiner* — Vinh T Lam
(74) *Attorney, Agent, or Firm* — Birch, Stewart, Kolasch & Birch, LLP

(57) ABSTRACT

An optical device is provided. The optical device includes a main body; a display unit which includes a polarization layer and which is disposed on one surface of the main body; and a camera module which is disposed in the main body and which overlaps the polarization layer in an optical axis direction. A first region of the polarization layer overlapping the camera module in the optical axis direction blocks or reflects at least some incident light when the camera module is not operated.

20 Claims, 3 Drawing Sheets

(56) References Cited

U.S. PATENT DOCUMENTS

| | | |
|---|---|---|
| 11,163,169 B2 | 11/2021 | Duckett, III et al. |
| 11,173,394 B2 | 11/2021 | Ogasawara |
| 11,460,619 B2 * | 10/2022 | Chen .................. H10K 59/8791 |
| 11,482,692 B2 | 10/2022 | Her et al. |
| 11,601,579 B2 | 3/2023 | Jia |
| 11,736,792 B2 * | 8/2023 | Lee ...................... H04N 23/632 |
| | | 348/207.99 |
| 11,758,253 B2 * | 9/2023 | Zhao ...................... H04N 23/57 |
| | | 348/374 |
| 11,875,757 B2 * | 1/2024 | Shiraishi .................. H04N 7/18 |
| 2014/0132854 A1 | 5/2014 | Wu et al. |
| 2017/0126979 A1 | 5/2017 | Evans, V et al. |
| 2017/0237884 A1 | 8/2017 | Evans, V et al. |
| 2017/0336546 A1 | 11/2017 | Ohyama et al. |
| 2018/0014400 A1 * | 1/2018 | Dighde .................. H05K 5/0017 |
| 2018/0259692 A1 | 9/2018 | Sharp et al. |
| 2019/0089880 A1 * | 3/2019 | Murao .................. G02F 1/1339 |
| 2019/0281708 A1 | 9/2019 | Franklin et al. |
| 2020/0169680 A1 * | 5/2020 | Park ....................... H04N 23/57 |
| 2020/0233469 A1 * | 7/2020 | Won ....................... G06F 1/1637 |
| 2021/0215944 A1 | 7/2021 | Kim et al. |

FOREIGN PATENT DOCUMENTS

| | | |
|---|---|---|
| CN | 101866075 A | 10/2010 |
| CN | 105676555 A | 6/2016 |
| CN | 106936144 A | 7/2017 |
| CN | 207503984 U | 6/2018 |
| CN | 108737699 A | 11/2018 |
| CN | 208210033 U | 12/2018 |
| CN | 109164624 A | 1/2019 |
| CN | 109860270 A | 6/2019 |
| JP | 2000-201286 A | 7/2000 |
| JP | 2012-83498 A | 4/2012 |
| JP | 2014-197203 A | 10/2014 |
| KR | 10-2019-0021639 A | 3/2019 |

* cited by examiner

OPTICAL DEVICE

CROSS REFERENCE TO RELATED APPLICATIONS

This application is a Continuation of U.S. application Ser. No. 17/632,291, filed Feb. 2, 2022, which is the National Phase of PCT/KR2020/011212 filed on Aug. 21, 2020, which claims priority under 35 U.S.C. § 119(a) to Patent Application No. 10-2019-0106058 filed in the Republic of Korea on Aug. 28, 2019, all of which are hereby expressly incorporated by reference into the present application.

TECHNICAL FIELD

The present invention relates to an optical device.

BACKGROUND ART

The content described below provides background information on the present embodiment and does not describe the prior art.

As the spread of various portable terminals is widely generalized and wireless Internet services are commercialized, the demands of consumers related to portable terminals are also diversifying, so that various types of additional devices are being installed in the portable terminals.

Among them, there is a camera module for photographing a subject as a photograph or a moving picture. Meanwhile, as various types of additional devices are installed in recent camera modules, there is a demand for miniaturization of the camera module.

SUMMARY OF THE INVENTION

Technical Subject

An object of the present invention is to provide an optical device capable of reducing the size of a product.

Technical Solution

An optical device according to one aspect of the present invention for achieving the above object comprises: a main body; a display unit which comprises a polarization layer and which is disposed on one surface of the main body; and a camera module which is disposed in the main body and which is overlapped with the polarization layer in an optical axis direction, wherein a first region of the polarization layer being overlapped with the camera module in the optical axis direction blocks or reflects at least a portion of an incident light when the camera module is not operating.

In addition, the first region may transmit the incident light when the camera module is operating.

In addition, the display unit may comprise a reflective layer disposed on one side of the polarization layer, and at least a portion of the camera module may be overlapped with the reflective layer in a direction perpendicular to the optical axis direction.

In addition, the camera module may comprise a control unit being electrically connected to the display unit.

In addition, the control unit may provide an OFF signal to the first region when the camera module is turned on, and may provide an ON signal to the first region when the camera module is turned off.

In addition, an OLED layer disposed on one side of the polarization layer is comprised, and the control unit may provide an OFF signal in a region being overlapped with the first region and the camera module in the optical axis direction among the OLED layer when the camera module is turned ON.

In addition, a phase delay layer disposed on one side of the OLED layer may be comprised, and at least a portion of the phase delay layer may be overlapped with the first region and the camera module in the optical axis direction.

In addition, the camera module may be disposed adjacent to an end portion of the display unit.

An optical device according to an aspect of the present invention for achieving the above object comprises: a main body; a display unit comprising a polarization layer comprising a first region and disposed on one surface of the main body; a camera module disposed on the main body and being overlapped with the first region in an optical axis direction; and a control unit electrically connected to the display unit and the camera module, wherein the control unit provides an OFF signal to the first region when the camera module is turned on, and may provide an ON signal to the first region when the camera module is turned OFF.

In addition, an OLED layer disposed on one side of the polarization layer is comprised, and the first region and the camera module may be overlapped with the OLED layer in the optical axis direction.

In addition, when the camera module is turned ON, the control unit may provide an OFF signal to a region being overlapped with the camera module and the first region in the optical axis direction among the OLED layer.

In addition, a phase delay layer disposed on one side of the OLED layer is comprised, and the first region and the camera module may be overlapped with the phase delay layer in the optical axis direction.

In addition, a reflective layer disposed on one side of the phase delay layer is comprised, and at least a portion of the camera module may be overlapped with the reflective layer in a direction perpendicular to the optical axis direction.

Advantageous Effects

Through the present embodiment, an optical device capable of reducing the size of a product can be provided.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (comprising technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may comprise the plural form unless specifically stated in the phrase, and when described as "at least one (or more than one) of A and B and C", it may comprise one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also comprise cases of being 'connected', 'coupled', or 'interconnected' due that another component between that other components.

In addition, when described as being formed or arranged in "on (above)" or "below (under)" of each component, "on (above)" or "below (under)" means that it comprises not only the case where the two components are directly in contact with, but also the case where one or more other components are formed or arranged between the two components. In addition, when expressed as "on (above)" or "below (under)", the meaning of not only an upward direction but also a downward direction based on one component may be comprised.

An 'optical axis direction' used below is defined as an optical axis direction of a camera module coupled to an optical device. Meanwhile, the 'optical axis direction' may correspond to a 'vertical direction', a 'z-axis direction', and the like.

Hereinafter, the present invention will be described in more detail with reference to the accompanying drawings.

Figure 1:
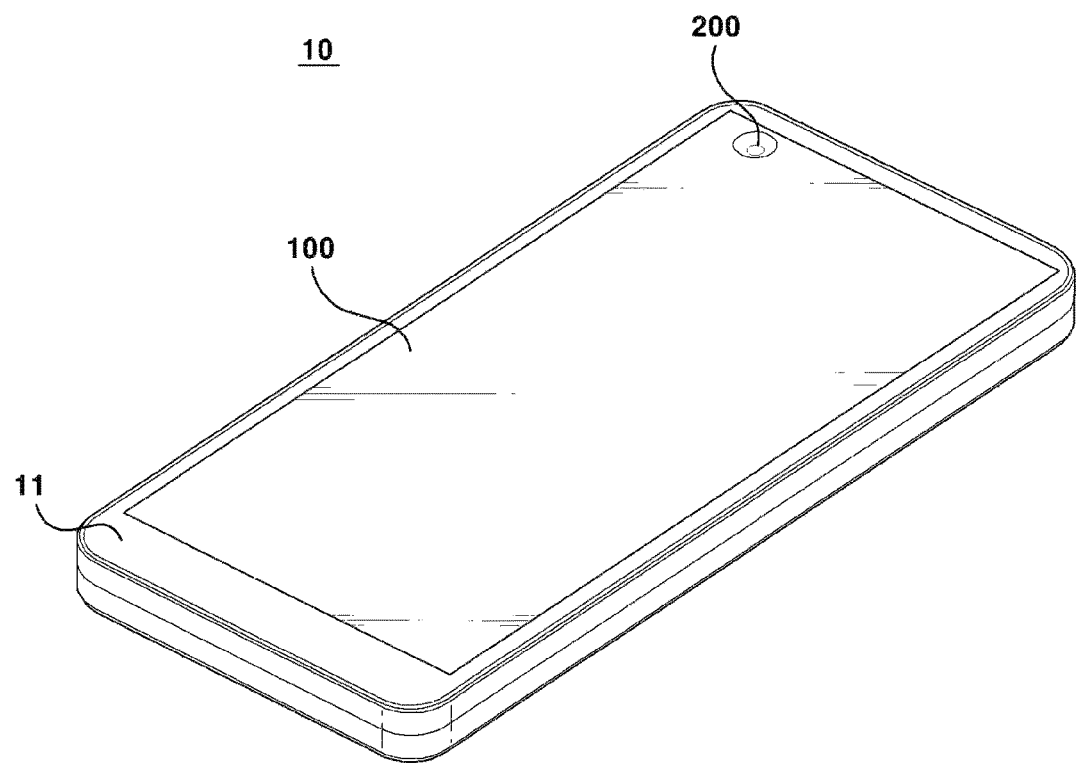
FIG. 1 is a perspective view of an optical device according to an embodiment of the present invention.
Figure 2:
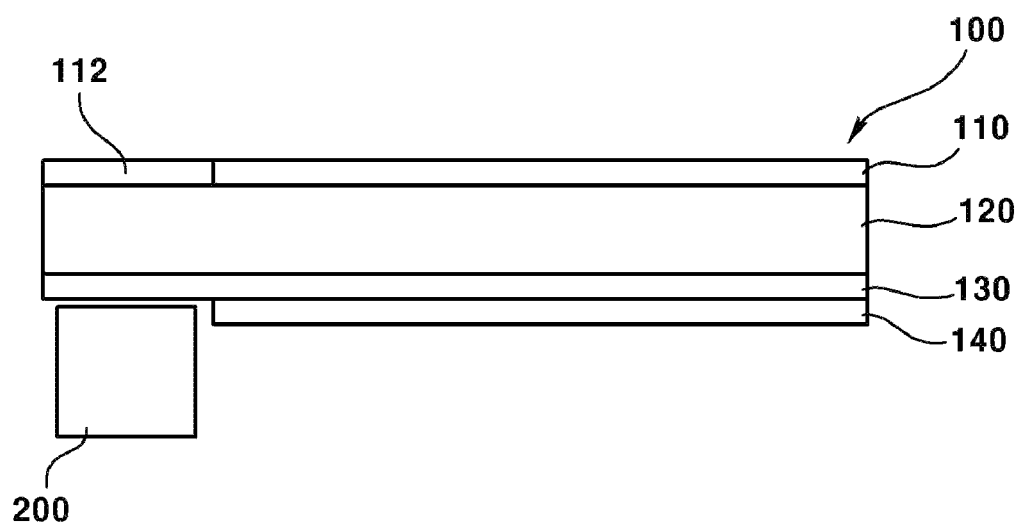
FIG. 2 is a cross-sectional view of an optical device according to an embodiment of the present invention.
Figure 3:
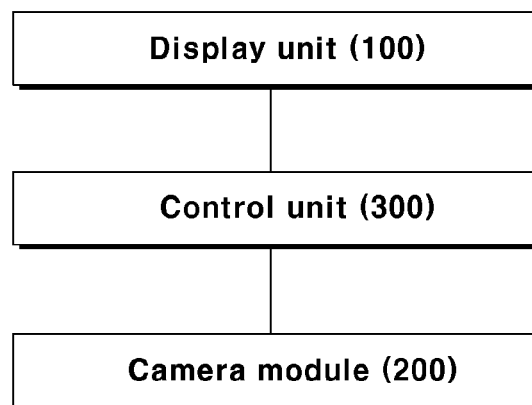
FIG. 3 is a block diagram of a partial configuration of an optical device according to an embodiment of the present invention.
Figure 4:
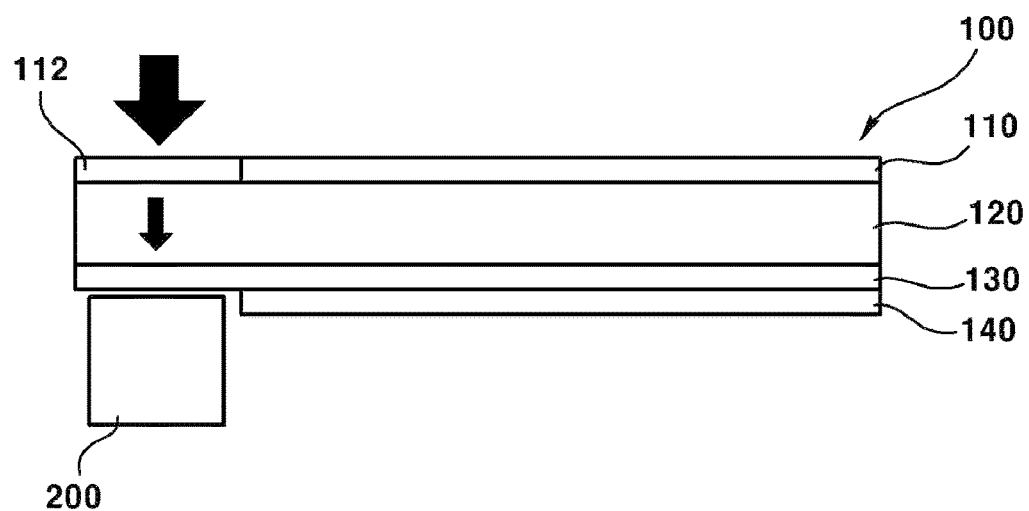
FIGS. 4 and 5 are diagrams illustrating an optical path incident to a camera module of an optical device according to an embodiment of the present invention.
Figure 5:
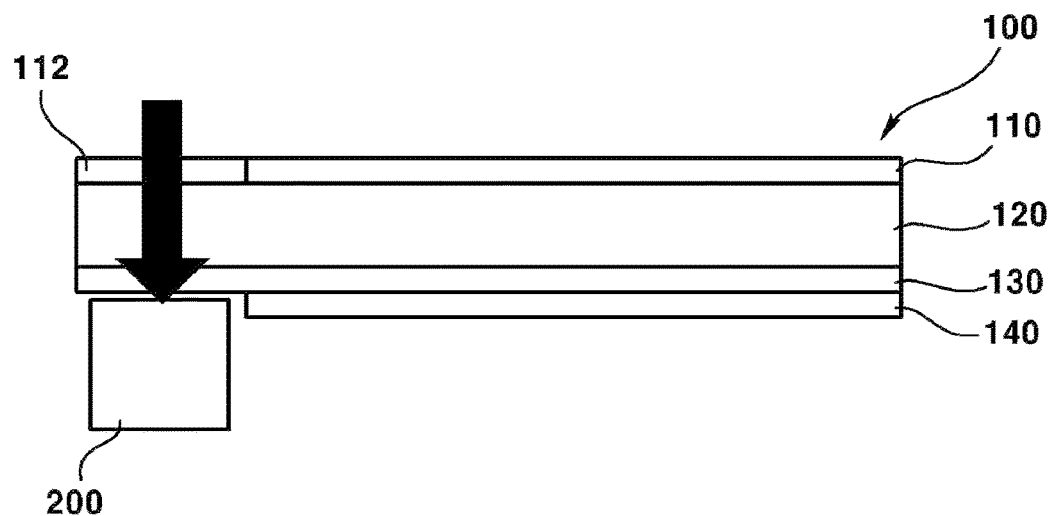

FIG. 1 is a perspective view of an optical device according to an embodiment of the present invention. FIG. 2 is a cross-sectional view of an optical device according to an embodiment of the present invention. FIG. 3 is a block diagram of a partial configuration of an optical device according to an embodiment of the present invention. FIGS. 4 and 5 are diagrams illustrating an optical path incident to a camera module of an optical device according to an embodiment of the present invention.

Referring to FIGS. 1 to 5, an optical device 10 according to an embodiment of the present invention may comprise a main body 11, a display unit 100, a camera module 200, and a control unit 300, but may be implemented except for some of these configurations, and additional configurations are not excluded.

The optical device 10 may be one among a hand phone, a mobile phone, a smart phone, a portable smart device, a digital camera, a laptop computer, a digital broadcasting terminal, a personal digital assistant (PDA), a portable multimedia player (PMP), and a navigation device. However, the type of the optical device 10 is not limited thereto, and any device for photographing an image or a picture may be comprised in the optical device 10.

The optical device 10 may comprise a main body 11. The main body 11 may form the outer appearance of the optical device 10. The display unit 100 may be disposed on one surface of the main body 11. The main body 11 may be formed in a hexahedral shape. The main body 11 may comprise an upper surface, a lower surface, and first to fourth side surfaces connecting the upper surface and the lower surface. The camera module 200 and the control unit 300 may be disposed in the inner space of the main body 11.

The optical device 10 may comprise a display unit 100. The display unit 100 may be disposed on one surface of the main body 11. The display unit 100 may be disposed on an upper surface of the main body 11. The display unit 100 may be overlapped with the camera module 200 in an optical axis direction. The display unit 100 may be electrically connected to the control unit 300. The display unit 100 may receive a current and/or a signal from the control unit 300.

The display unit 100 may comprise a polarization layer 110. The polarization layer 110 may be a polarizing plate. The polarization layer 110 may be disposed on the OLED layer 120. The polarization layer 110 may reflect or block at least a portion of incident light incident from the outside. The polarization layer 110 may transmit at least a portion of incident light incident from the outside. At least a portion of the polarization layer 110 may be overlapped with the camera module 200 in an optical axis direction. At least a portion of the polarization layer 110 may be overlapped with the OLED layer 120, the phase delay layer 130, and the reflective layer 140 in an optical axis direction.

The polarization layer 110 may comprise a first region 112. The first region 112 may be formed in a region being overlapped with the camera module 200 in an optical axis direction among the polarization layer 110. The first region 112 may be electrically connected to the control unit 300. The first region 112 may receive a current and/or a signal from the control unit 300. When the camera module 200 operates, the first region 112 may receive an OFF signal from the control unit 300 and transmit at least a portion of incident light incident from the outside toward the camera module 200. When the camera module 200 is not operating, the first region 112 may receive an ON signal from the control unit 300 to reflect or block at least a portion of incident light incident from the outside. Through this, when the camera module 200 operates, external light is incident on the camera module 200 to form an image, and when the camera module 200 is not operating, an image is outputted from the display unit 100 toward the outside by blocking external light so that the user can see it. That is, since the area of the image outputted from the display unit 100 toward the outside can be widened, the size of the product can be reduced.

The display unit 100 may comprise an OLED layer 120. The OLED layer 120 may be a thin film light emitting diode (LED) made of a film of an organic compound in which the light emitting layer emits light in response to an electric current. The OLED layer 120 may be disposed below the polarization layer 110. The OLED layer 120 may be disposed on the phase delay layer 130. The OLED layer 120 may be overlapped with the polarization layer 110 in an optical axis direction. The OLED layer 120 may be formed to have a size corresponding to the polarization layer 110. When the camera module 200 is turned ON, a region being overlapped with the first region 112 of the OLED layer 120 and the camera module 200 in an optical axis direction may be turned OFF by receiving a signal from the control unit 300. Through this, an external light may be incident to the camera module 200.

The display unit 100 may comprise a phase delay layer 130. The phase delay layer 130 may be disposed below the OLED layer 120. The OLED layer 120 may be disposed on the reflective layer 140. The phase delay layer 130 may be overlapped with the OLED layer 120 and the camera module 200 in an optical axis direction. The phase delay layer 130 may be overlapped with the first region 112 in an optical axis direction. When the camera module 200 is not operating, the first region 112 may be turned ON to reflect or block at least a portion of incident light incident from the outside. In this case, the light passing through the polarization layer 110 and the OLED layer 120 is reduced by the incident light, and proceeds to the camera module 200 with the phase shifted by 45 degrees by the phase delay layer 130. This light is reflected from the camera module 200 again, and the phase is rotated by 45 degrees so that a total of 90 degrees of polarization proceeds. The 90 degree polarized light is blocked by the polarization layer 110 to prevent the user from recognizing the external light reflection.

The display unit 100 may comprise a reflective layer 140. The reflective layer 140 may be a reflector. The reflective layer 140 may be disposed below the phase delay layer 130. The reflective layer 140 may not be overlapped with the camera module 200 in an optical axis direction. The reflective layer 140 may not be overlapped with the first region 112 in an optical axis direction. The reflective layer 140 may be overlapped with the camera module 200 in a direction perpendicular to the optical axis direction. To this end, space efficiency can be enhanced.

The optical device 10 may comprise a camera module 200. The camera module 200 may comprise a lens and an image sensor. The camera module 200 may be disposed in the main body 11. The camera module 200 may be disposed below the display unit 100. The camera module 200 may be overlapped with the first region 112 in an optical axis direction. The camera module 200 may be overlapped with the OLED layer 120 and the phase delay layer 130 in an optical axis direction. The camera module 200 may not be overlapped with the reflective layer 140 in an optical axis direction. The camera module 200 may be overlapped with the reflective layer 140 in a direction perpendicular to the optical axis direction. The upper region of the camera module 200 may be overlapped with the reflective layer 140 in a direction perpendicular to the optical axis direction. The camera module 200 may be electrically connected to the control unit 300.

The optical device 10 may comprise a control unit 300. The control unit 300 may be disposed on the main body 11. The control unit 300 may be electrically connected to the display unit 100 and the camera module 200. The control unit 300 may provide a current and/or a control signal to the display unit 100 and the camera module 200.

The control unit 300 may provide an OFF signal to the camera module 200. In this case, the control unit 300 may provide an ON signal to the first region 112 and an ON signal to the OLED layer 120 to output an image in the entire area of the OLED layer 120.

The control unit 300 may provide an ON signal to the camera module 200. In this case, the control unit 300 provides an OFF signal to a first region 112, and may provide an OFF signal to a region being overlapped with the first region 112 and the camera module 200 in an optical axis direction among the OLED layer 120. Through this, most of the light incident from the outside is incident on the camera module 200 to obtain an external image.

Although the embodiment of the present invention has been described above with reference to the accompanying drawings, those of ordinary skill in the art to which the present invention belongs will understand that the present invention may be embodied in other specific forms without changing the technical spirit or essential features thereof. Therefore, it should be understood that the embodiments described above are illustrative in all respects and not restrictive.

What is claimed is:

1. An optical device comprising:
a main body;
a display unit disposed on the main body; and
a camera module disposed on the main body,
wherein the display unit comprises a polarization layer and a reflective layer,
wherein the polarization layer comprises a first region overlapped with the camera module in an optical axis direction of the camera module, and
wherein the camera module is not overlapped with the reflective layer in the optical axis direction.

2. The optical device of claim 1, wherein the camera module is overlapped with the reflective layer in a direction perpendicular to the optical axis direction.

3. The optical device of claim 1, wherein the first region of the polarization layer is configured to block or reflect at least a portion of an incident light when the camera module is not operating.

4. The optical device of claim 3, wherein the first region of the polarization layer is configured to transmit the incident light when the camera module is operating.

5. The optical device of claim 1, comprising a control unit electrically connected with the camera module and the display unit.

6. The optical device of claim 5, wherein the control unit is configured to provide an OFF signal to the first region of the polarization layer when the camera module is turned ON, and is configured to provide an ON signal to the first region of the polarization layer when the camera module is turned OFF.

7. The optical device of claim 5, wherein the display unit comprises an OLED layer disposed between the polarization layer and the reflective layer, and
wherein the OLED layer comprises a first region overlapped with the camera module in the optical axis direction.

8. The optical device of claim 7, wherein the control unit is configured to provide an OFF signal to the first region of the OLED layer when the camera module is turned ON.

9. The optical device of claim 7, wherein the display unit comprises a phase delay layer disposed between the OLED layer and the reflective layer, and
wherein the phase delay layer comprises a first region overlapped with the camera module in the optical axis direction.

10. The optical device of claim 9, wherein a phase of a light proceeding to the camera module is shifted by 45 degrees by the phase delay layer when the camera module is turned OFF.

11. The optical device of claim 10, wherein a phase of a light reflected from the camera module is shifted by 45 degrees by the phase delay layer when the camera module is turned OFF.

12. The optical device of claim 9, wherein the camera module is spaced apart from both the phase delay layer and the reflective layer, and wherein a gap between the camera module and the reflective layer in a direction perpendicular to the optical axis direction is greater than a gap between the camera module and the phase delay layer in the optical axis direction.

13. The optical device of claim 1, wherein the camera module is disposed adjacent to an end portion of the display unit.

14. The optical device of claim 1, wherein the camera module is spaced apart from the display unit.

15. The optical device of claim 1, wherein, in a direction perpendicular to the optical axis direction, a width of the first region of the polarization layer is greater than a width of the camera module.

16. The optical device of claim 1, wherein the first region of the polarization layer is not overlapped with the reflective layer in the optical axis direction.

17. An optical device comprising:
a main body;
a display unit disposed on the main body; and
a camera module disposed on the main body, wherein the display unit comprises a polarization layer and a reflective layer, wherein the polarization layer comprises a first region overlapped with the camera module in an optical axis direction of the camera module, and wherein the camera module is overlapped with the reflective layer in a direction perpendicular to the optical axis direction.

18. The optical device of claim 17, wherein the first region of the polarization layer is configured to block or reflect at least a portion of an incident light when the camera module is not operating.

19. The optical device of claim 18, wherein the first region of the polarization layer is configured to transmit the incident light when the camera module is operating.

20. The optical device of claim 17, comprising a control unit electrically connected with the camera module and the display unit, wherein the control unit is configured to provide an OFF signal to the first region of the polarization layer when the camera module is turned ON, and is configured to provide an ON signal to the first region of the polarization layer when the camera module is turned OFF.

* * * * *